United States Patent [19]

Johnson et al.

[11] Patent Number: 4,998,158
[45] Date of Patent: Mar. 5, 1991

[54] HYPOEUTECTIC OHMIC CONTACT TO N-TYPE GALLIUM ARSENIDE WITH DIFFUSION BARRIER

[75] Inventors: Karl J. Johnson, Scottsdale; Charles E. Weitzel, Phoenix, both of Ariz.

[73] Assignee: Motorola, Inc., Schaumburg, Ill.

[21] Appl. No.: 56,076

[22] Filed: Jun. 1, 1987

[51] Int. Cl.⁵ ................. H01L 29/460; H01L 29/540; H01L 29/620
[52] U.S. Cl. ......................................... 357/71; 357/65
[58] Field of Search .................................... 357/71, 65

[56] References Cited

U.S. PATENT DOCUMENTS 3,028,663  4/1962  Iwersen et al. ............... 357/71
3,273,979  9/1966  Budnick ........................ 357/71
3,370,207  2/1968  Fabel et al. ................... 357/71
4,188,710  2/1980  Davey et al. .................. 357/71
4,300,149  11/1981 Howard et al. ................ 357/71

FOREIGN PATENT DOCUMENTS 52-29183  4/1977  Japan ............................ 357/71
59-66166  4/1984  Japan ............................ 357/71

OTHER PUBLICATIONS

J. K. Howard; Electromigration Improvement of Al—Cu or Au Conductors; IBM Technical Disclosure Bulletin, vol. 21, No. 12, May 1979.

Primary Examiner—Rolf Hille
Assistant Examiner—Peter Toby Brown
Attorney, Agent, or Firm—Joe E. Barbee

[57] ABSTRACT

A hypoeutectic ohmic contact to gallium arsenide comprising a refractory metal layer is provided which reduces the outdiffusion of gallium and arsenic which would otherwise be seen as impurities at the outer surface of the ohmic contact.

1 Claim, 1 Drawing Sheet 4,998,158

HYPOEUTECTIC OHMIC CONTACT TO N-TYPE GALLIUM ARSENIDE WITH DIFFUSION BARRIER

BACKGROUND OF THE INVENTION

The present invention relates in general to ohmic contacts useful in semiconductor devices, and more particularly, to a hypoeutectic ohmic contact which is improved by the addition of a diffusion barrier.

Low resistivity reliable ohmic contacts to n-GaAs have been previously implemented using a eutectic combination of gold and germanium. In a previously filed co-pending application, Serial No. 769,031, there has been described a hypoeutectic ohmic contact to gallium arsenide. The contact which results from this hypoeutectic ohmic contact process has a gold surface which retains its smooth surface morphology and is consistently reproducible by an easily controllable process. While the resultant contact has the required low resistivity and physical characteristics to provide a good electrical contact to a GaAs surface, there are other characteristics which make this type of contact undesirable for use with an E-beam lithography process.

In certain manufacturing processes the metal layer which is deposited as an ohmic contact on a GaAs surface is used not only to provide a good electrical contact to the layer but in addition is used as a key to provide alignment during certain E-beam lithography processes. In using the ohmic contact as a key during an alignment step, the E-beam signal senses the difference in reflected energy from the gold surface of the ohmic contact and the reflected energy from the GaAs surface. Any gallium appearing in the gold portion of the ohmic contact would therefore degrade the resolution of the E-beam signal when differentiating between the ohmic contact gold and the GaAs surface. One of the characteristics of the hypoeutectic process above described is that gallium outdiffuses from the gallium arsenide surface into the gold layer. In some cases this outdiffusion is to such an extent that the gallium is clearly visible during E-beam lithography and therefore degrades the resolution of the E-beam lithography process.

A previously known process to alleviate this problem is to add a second layer comprising titanium platinum and gold to the ohmic contact layer. When this second layer is added the platinum portion acts as a barrier and prevents the gallium from the GaAs surface from penetrating through to the outer surface of the gold layer. However, this involves a second manufacturing step which is conducted at a different temperature under different conditions from the formation of the hypoeutectic contact. In addition, this second step would normally take place after the manufacturing step during which the E-beam lithography would be used and therefore would not be feasible for reducing the amount of gallium visible to the E-beam signal in the gold portion of the hypoeutectic ohmic contact layer. It would therefore be desirable to have an improved hypoeutectic contact with reduced gallium outdiffusion from the underlying gallium arsenide layer. It would also be desirable if this improved hypoeutectic contact could be formed in a one step process which is accomplished prior to a E-beam lithography.

Accordingly, is an object of the present invention to provide an improved hypoeutectic ohmic contact for use on semiconductor surfaces.

Another object of the present invention is to provide an improved hypoeutectic ohmic contact having a barrier layer.

Yet another object of the present invention is to provide a hypoeutectic ohmic contact with a barrier layer which can be produced in a single manufacturing process step.

A still further object of the present invention is to provide a hypoeutectic ohmic contact by a process which is suitable for use prior to E-beam lithography.

SUMMARY OF THE INVENTION

The above and other objects and advantages of the present invention are obtained by forming a hypoeutectic contact on an underlying gallium arsenide surface which comprises a first layer of nickel, a first layer of germanium, a first layer of gold, a first layer of platinum and a second layer of gold. These layers are all applied during a single manufacturing step such as, for example, evaporating or sputtering. The entire structure is then alloyed under normal conditions for obtaining an ohmic contact, approximately 400°–460° C. for 5 to 10 minutes at temperature in a chamber containing a forming gas. The first layer of nickel, first layer of germanium and first layer of gold alloy make the ohmic contact as described in co-pending application serial no. 769,031, while the platinum and second layer of gold serve to form an outdiffusion barrier layer with the platinum diffusing into both the first and second gold layers, thereby forming a diffusion barrier to prevent gallium or arsenic from penetrating to the second gold layer.

The subject matter which is regarded as the invention is set forth in the appended claims The invention itself, however, together with further objects and advantages thereof, may be best understood by referring to the following detailed description taken in conjunction with the accompanying drawings

DETAILED DESCRIPTION OF THE INVENTION

Figure 1:
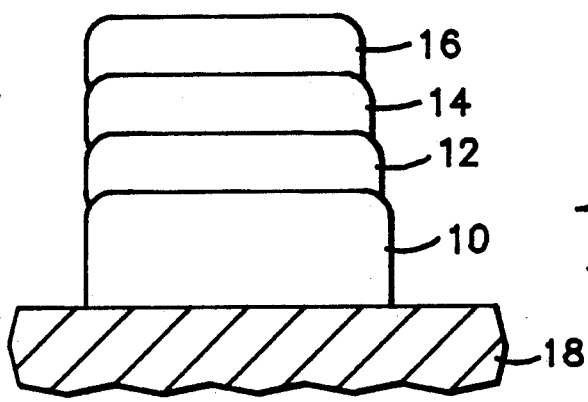
FIG. 1 illustrates a prior art method of providing a platinum outdiffusion barrier over an ohmic metal contact to gallium arsenide.

Referring now to FIG. 1 there is shown a cross-sectional diagram of a known method for providing a barrier layer which comprises first forming the underlying ohmic metal contact layer 10 via either conventional methods or the hypoeutectic method previously described, and then during a second process step adding the overlying layers of titanium 12, platinum 14 and gold 16. This process requires that the second layer comprising titanium, platinum and gold be added during a step which requires temperatures below the alloying temperature of the contact. In addition, during a normal manufacturing process this second step of adding the barrier layer would take place subsequent to an E-beam lithography step if such were used during manufacture of the semiconductor device in question. Metal contact layer 10 is formed on an n-type BaAs layer 18.

Figure 2:
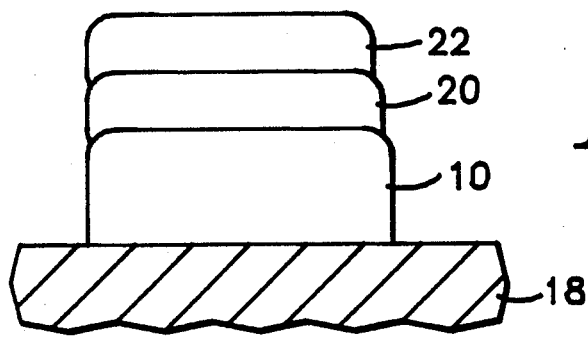
FIG. 2 illustrates a cross-sectional view of a portion of an ohmic contact showing the hypoeutectic ohmic contact, a barrier layer and an outer gold layer in accordance with the present invention.

In FIG. 2 there is shown a simplified cross-section diagram illustrating the addition of a barrier layer 20 and overlying gold layer 22 which are added during the same manufacturing process which is used to create the underlying hypoeutectic ohmic metal layer 10.

Figure 3:
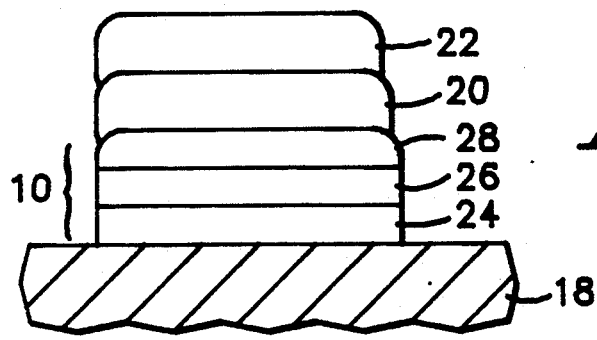
FIG. 3 is a cross-section of a preferred embodiment of the present invention showing the approximate dimensions of the various layers as applied to achieve the various characteristics of the present invention.

In FIG. 3 there is shown a more detailed cross-sectional diagram of a preferred embodiment wherein the underlying hypoeutectic contact layer is shown to comprise a nickel layer 24, approximately 100 angstroms thick; a germanium layer 26, approximately 100 angstroms thick; and a gold layer, approximately 1000 angstroms thick. Overlying platinum layer 20, approximately 1000 to 2500 angstroms thick, is added. Finally, final gold layer 22, approximately 3000 angstroms thick, is added to provide the final contact layer of gold which has good surface morphology as a result of the underlying hypoeutectic layer 10 and good purity as a result of the barrier layer 20, which prevents gallium and arsenic from outdiffusing to gold layer 22. The structure of FIG. 3 is alloyed in an atmosphere of 95 percent nitrogen and 5 percent hydrogen at 400°–460° C. for 5 to 10 minutes. The alloyed metallization establishes an ohmic (non-rectifying) contact to the N-type gallium arsenide. The resulting ohmic contact is low in contact resistance and maintains a smooth (as deposited) gold surface morphology and purity which results from the underlying platinum layer 20.

As with the original hypoeutectic ohmic contact process, this improved process may be accomplished with relatively wide variations in both the process times and metal layer thicknesses. In addition, the ratios of the elements may vary within a relatively wide range without adversely affecting the resistivity of the contact or the purity and morphology of the final gold layer.

By using the hypoeutectic mixture (Au 0.973 and Ge 0.027) for the underlying metal contact, the final gold layer 22 does not completely melt and thereby maintains the smooth surface of the original gold layer.

During the alloying process platinum layer 20 will diffuse into both gold layer 28 and gold layer 22 to establish an equilibrium state of approximately 15 percent by weight of platinum to platinum plus gold. The remaining platinum remains solid and acts as a diffusion barrier to gallium and arsenic which results in an improved hypoeutectic contact.

What has been provided, therefore, is an improved hypoeutectic contact to a gallium arsenide surface wherein said contact comprises a barrier layer which prevents gallium and arsenic from outdiffusing into the outermost gold layer of such contact. While the invention has been particularly described as used with gallium arsenide and in connection with a specific deposition process, it is to be understood that variations in the deposition process, as well as the composition of the underlying semiconductor material and dimensions of the various components of the contact layer may be used without departing from the scope of the invention. For example, refractory metals other than platinum can be used to obtain similar results.

We claim:

1. An ohmic contact for a portion of a GaAs surface of a semiconductor device having at least one GaAs surface, said ohmic contact comprising:

a layer of nickel provided over said portion of said GaAs surface;

a layer of germanium provided over said nickel layer;

a first gold layer provided over said germanium layer;

a refractory metal layer provided over said first gold layer; and a second gold layer provided over said refractory metal layer, wherein said germanium layer and said first gold layer form a hypoeutectic ratio and a portion of said refractory metal layer is diffused into said first and second gold layers to form a stable refractory metal layer which acts as a barrier to reduce migration of gallium or arsenic from said gallium arsenide surface to said second gold layer; and wherein said hypoeutectic ratio is Au 0.973 Ge 0.027.

* * * * *